(12) United States Patent
Ikeda et al.

(10) Patent No.: US 9,704,828 B2
(45) Date of Patent: Jul. 11, 2017

(54) SEMICONDUCTOR MODULE

(71) Applicant: SHINDENGEN ELECTRIC MANUFACTURING CO., LTD., Tokyo (JP)

(72) Inventors: Kosuke Ikeda, Hanno (JP); Yuji Morinaga, Hanno (JP); Osamu Matsuzaki, Hanno (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 0 days.

(21) Appl. No.: 14/786,295

(22) PCT Filed: Oct. 16, 2014

(86) PCT No.: PCT/JP2014/077545
§ 371 (c)(1),
(2) Date: Oct. 22, 2015

(87) PCT Pub. No.: WO2016/059702
PCT Pub. Date: Apr. 21, 2016

(65) Prior Publication Data
US 2016/0254250 A1    Sep. 1, 2016

(51) Int. Cl.
*H01L 23/36* (2006.01)
*H01L 23/367* (2006.01)
(Continued)

(52) U.S. Cl.
CPC ...... *H01L 25/0657* (2013.01); *H01L 23/3735* (2013.01); *H01L 23/492* (2013.01);
(Continued)

(58) Field of Classification Search
None
See application file for complete search history.

(56) References Cited

U.S. PATENT DOCUMENTS

| 7,606,034 B2 * | 10/2009 | Paul | H01L 23/367 165/80.3 |
| 2006/0133043 A1 * | 6/2006 | Boudreaux | H05K 1/144 361/704 |

(Continued)

FOREIGN PATENT DOCUMENTS

| JP | 2001-156225 | 6/2001 |
| JP | 2011-023570 | 2/2011 |

(Continued)

OTHER PUBLICATIONS

International Search Report for PCT/JP2014/077545, mailed Nov. 25, 2014 and English translation (4 pages).
International Preliminary Report on Patentability for PCT/JP2014/077545, mailed Mar. 3, 2015 and English translation (8 pages).

*Primary Examiner* — Johannes P Mondt
(74) *Attorney, Agent, or Firm* — Nixon & Vanderhye P.C.

(57) ABSTRACT

A semiconductor module according to one embodiment of the present invention includes: a first circuit board having thermal conductivity; a second circuit board having thermal conductivity and disposed opposing the first circuit board; a first semiconductor element joined to an opposing surface of the first circuit board opposing the second circuit board; a second semiconductor element joined to an opposing surface of the second circuit board opposing the first circuit board; and a connector electrically connecting the first semiconductor element and the second semiconductor element. The connector includes a portion which is sandwiched between the first semiconductor element and the second circuit board without through the second semiconductor element, and which is in contact with the first semiconductor element and the second circuit board.

2 Claims, 5 Drawing Sheets

(51) Int. Cl.
  *H01L 23/495* (2006.01)
  *H01L 25/065* (2006.01)
  *H01L 23/00* (2006.01)
  *H01L 23/373* (2006.01)
  *H01L 23/492* (2006.01)
  *H01L 23/498* (2006.01)
  *H01L 25/07* (2006.01)

(52) U.S. Cl.
  CPC .. *H01L 23/49531* (2013.01); *H01L 23/49833* (2013.01); *H01L 24/40* (2013.01); *H01L 25/065* (2013.01); *H01L 25/074* (2013.01); *H01L 2224/32135* (2013.01); *H01L 2224/32141* (2013.01); *H01L 2224/32145* (2013.01); *H01L 2224/32151* (2013.01); *H01L 2225/06506* (2013.01); *H01L 2225/06562* (2013.01); *H01L 2225/06572* (2013.01); *H01L 2225/06589* (2013.01)

(56) References Cited

U.S. PATENT DOCUMENTS

| | | | |
|---|---|---|---|
| 2007/0164423 A1* | 7/2007 | Standing | H01L 24/33 257/706 |
| 2008/0303138 A1 | 12/2008 | Flett | |
| 2010/0301496 A1 | 12/2010 | Koduri | |
| 2012/0155047 A1* | 6/2012 | Kim | H01L 25/105 361/783 |
| 2012/0228757 A1 | 9/2012 | Kitami et al. | |

FOREIGN PATENT DOCUMENTS

| | | |
|---|---|---|
| JP | 2011-114176 | 6/2011 |
| JP | 2012-028398 | 2/2012 |
| JP | 2012-248658 | 12/2012 |
| JP | 2013-110181 | 6/2013 |
| JP | 2014-127538 | 7/2014 |
| WO | WO 2011/064841 | 6/2011 |

* cited by examiner

SEMICONDUCTOR MODULE

This application is the U.S. national phase of International Application No. PCT/JP2014/077545 filed 16 Oct. 16, 2014 which designated the U.S., the entire content of which is hereby incorporated by reference.

TECHNICAL FIELD

The present invention relates to a semiconductor module.

BACKGROUND ART

As a semiconductor module, a semiconductor module including a plurality of semiconductor elements is known (for example, Patent Documents 1-4).

CITATION LIST

Patent Document

[Patent Document 1] Japanese Patent Application Laid-Open Publication No. 2011-23570
[Patent Document 2] Japanese Patent Application Laid-Open Publication No. 2013-110181
[Patent Document 3] Japanese Patent Application Laid-Open Publication No. 2001-156225
[Patent Document 4] Japanese Patent Application Laid-Open Publication No. 2012-28398

DISCLOSURE OF THE INVENTION

Problems to be Solved by the Invention

In a semiconductor module, it is required to integrate a plurality of semiconductor elements with high density. As a technique enabling high-density integration, a structure such that a plurality of semiconductor elements are stacked through a connector is considered. In this structure, however, a plurality of semiconductor elements are arranged adjacently in the stacking direction through the connector. Therefore, part of heat released from each semiconductor element flows into another adjacent semiconductor element through the connector. For this reason, each semiconductor element will be heated by the heat released from the other semiconductor devices, and there is a problem on heat dissipation.

For the above reason, an object of the present invention is to provide a semiconductor module capable of efficiently releasing heat of semiconductor elements.

Means for Solving the Problems

To achieve the above object, a semiconductor module according to the present invention includes: a first circuit board having thermal conductivity; a second circuit board having thermal conductivity and disposed opposing the first circuit board; a first semiconductor element joined to an opposing surface of the first circuit board opposing the second circuit board; a second semiconductor element joined to an opposing surface of the second circuit board opposing the first circuit board; and a connector having thermal conductivity and electrically connecting the first semiconductor element and the second semiconductor element. The connector includes a first element joining portion which is sandwiched between the first semiconductor element and the second circuit board without through the second semiconductor element, and which is in contact with the first semiconductor element and the second circuit board, but is not in contact with the first circuit board. The first element joining portion is spatially separated from the first circuit board by the first semiconductor element.

Effects of the Invention

According to the semiconductor module of the present invention, the connector includes the portion sandwiched between the first semiconductor element and the second circuit board, without through the second semiconductor element. For this reason, at least a part of heat of the first semiconductor device is transferred directly to the second circuit board, without through the second semiconductor element. Thereby, the heat of the first semiconductor element is efficiently released from both the first circuit board and the second circuit board. Additionally, the heat that flows from the first semiconductor device into the second semiconductor element is reduced. Thereby, it is possible to suppress the second semiconductor element from being heated by the heat released from the first semiconductor device.

Accordingly, according to the present invention, it is possible to provide a semiconductor module with high radiation.

MODE FOR CARRYING OUT THE INVENTION

First Embodiment

Hereinafter, a semiconductor module according to a first embodiment of the present invention will be described with reference to FIGS. 1A, 1B, and FIG. 2.

Figure 1A:
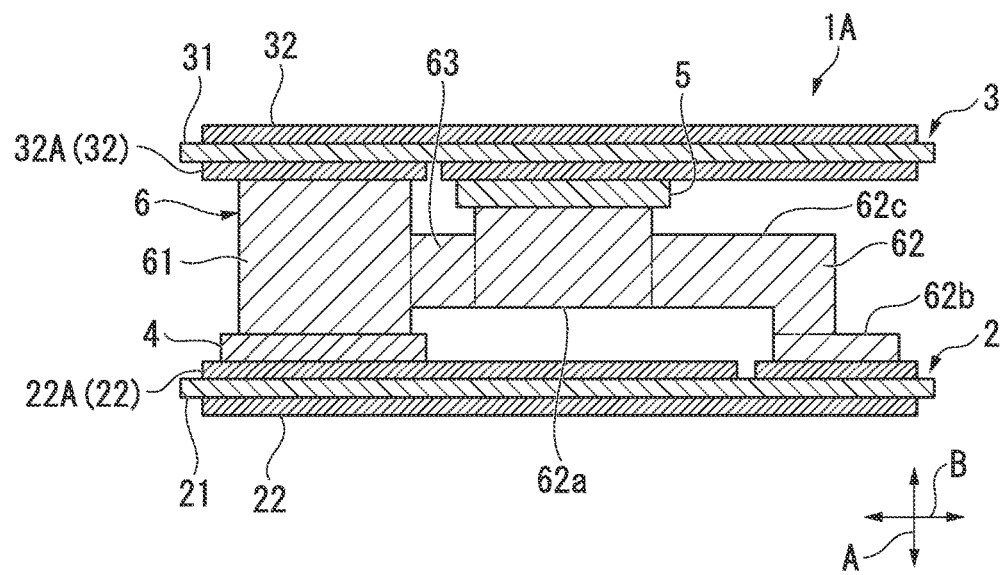
FIG. 1A is a diagram showing an example of a semiconductor module according to a first embodiment of the present invention.
Figure 1B:
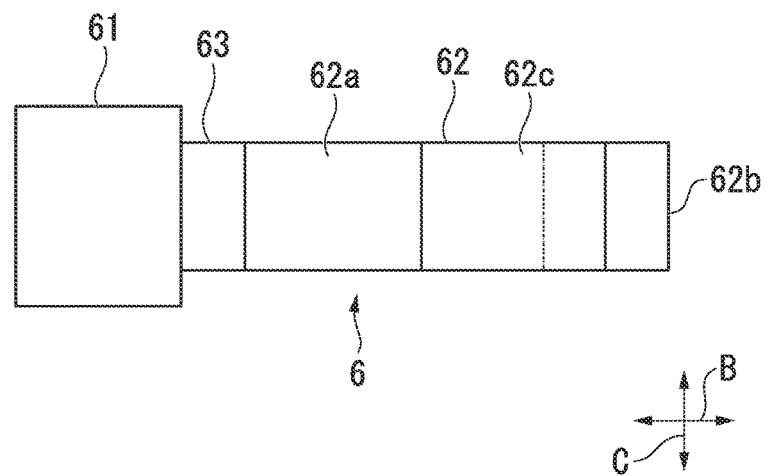
FIG. 1B is a diagram showing a connector shown in FIG. 1A viewed from a first circuit board side in a circuit board perpendicular direction.
Figure 2:
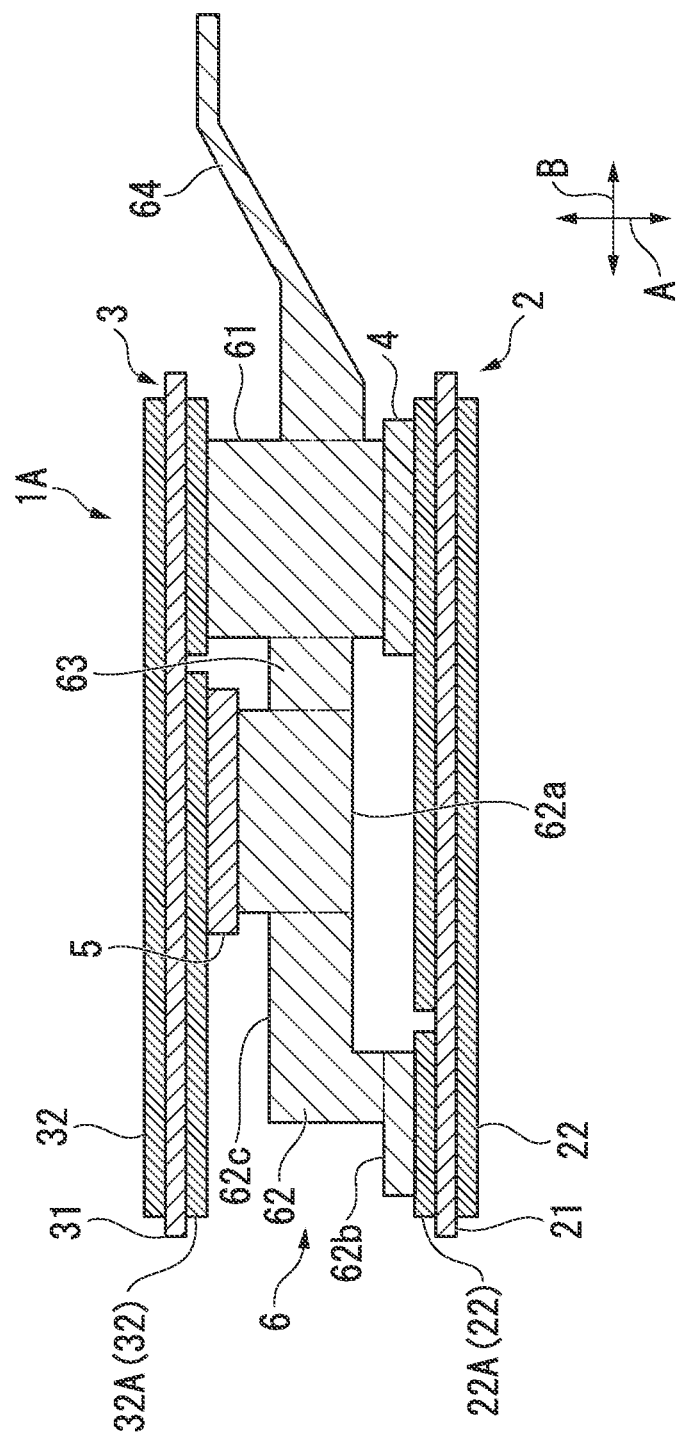
FIG. 2 is a diagram showing an embodiment in a case where the connector of the semiconductor module according to the first embodiment of the present invention is joined to an external connecting lead.

As shown in FIGS. 1A and 1B, a semiconductor module 1A according to the first embodiment includes a first circuit board 2, a second circuit board 3 disposed opposing the first circuit board 2, a first semiconductor element 4 joined to the circuit board 2, and a second semiconductor element 5 joined to the second circuit board 3, a connector 6 electrically connecting the first semiconductor element 4 and the second semiconductor element 5.

The first circuit board 2 and the second circuit board 3 of the present embodiment are, for example, ceramic boards each having thermal conductivity. The first circuit board 2 and the second circuit board 3 include plate-like ceramic plates 21 and 31 having insulating property, and conductive layers 22 and 32 provided on main surfaces of the ceramic plates 21 and 31. In the present embodiment, the first circuit board 2 and the second circuit board 3 are provided with the conductive layers 22 and 32 on both main surfaces of the ceramic plates 21 and 31. It is sufficient that the conductive layers 22 and 32 have electrical conductivity, but it is preferable that the conductive layers 22 and 32 are made of a material with high electrical conductivity, such as copper.

The first circuit board 2 and the second circuit board 3 are spaced from each other in a thickness direction of the ceramic plates 21 and 31, so that conductive layers 22A and 32A of the first circuit board 2 and the second circuit board 3 (hereinafter referred to as the first conductive layers 22A and 32A) oppose each other. The first conductive layers 22A and 32A of the first circuit board 2 and the second circuit board 3, together with the first semiconductor element 4, the second semiconductor element 5, and the connector 6, are formed as a wiring pattern constituting a circuit of the semiconductor module 1A.

A first semiconductor element 4 is joined to the first conductive layer 22A of the first circuit board 2. The second semiconductor element 5 is joined to the first conductive layer 32A of the second circuit board 3.

Specifically, one main surface of the first semiconductor element 4 is joined to the first conductive layer 22A of the first circuit board 2, using a conductive adhesive (not shown), such as solder. Additionally, one main surface of the second semiconductor element 5 is joined to the first conductive layer 32A of the second circuit board 3, using a conductive adhesive (not shown), such as solder. Thereby, the first semiconductor element 4 is electrically connected to the first conductive layer 22A of the first circuit board 2, and the second semiconductor element 5 is electrically connected to the first conductive layer 32A of the second circuit board 3.

In the present embodiment, an electrode of the first semiconductor element 4 joined to the first circuit board 2 is configured to differ from an electrode of the second semiconductor element 5 joined to the second circuit board 3.

The first semiconductor device 4 and the second semiconductor element 5 joined as described above are arranged at positions so as not to overlap each other when viewed from a direction perpendicular to the opposing surface of the first circuit board 2 opposing the second circuit board 3 (direction indicated by an arrow A shown in FIG. 1A, hereinafter referred to as a circuit board perpendicular direction A).

Here, description will be given hereinafter assuming that a first circuit board surface direction B represents a direction which is orthogonal to the circuit board perpendicular direction A and in which the first semiconductor element 4 and the semiconductor element 5 are arranged (direction indicated by an arrow B shown in FIG. 1A), and a second circuit board surface direction C represents a direction orthogonal to the circuit board perpendicular direction A and the first circuit board surface direction B (direction indicated by an arrow C shown in FIG. 1B).

The connector 6 includes, for example, a conductive material, such as copper, and serves to electrically connect the first semiconductor element 4 and the second semiconductor element 5. The connector 6 is joined to the first semiconductor element 4 and the second semiconductor element 5. Additionally, the connector 6 is joined to the first conductive layers 22A and 32A of the first circuit board 2 and the second circuit board 3.

The connector 6 of the present embodiment includes a first element joining portion 61 joined to the first semiconductor element 4, a second element joining portion 62 joined to the second semiconductor element 5, and a connecting portion 63 connecting the first element joining portion 61 and the second element joining portion 62. These are formed integrally and arranged in order of the first element joining portion 61, the connecting portion 63, and the second joining portion 62, from one side to the other side of the first circuit board surface direction B.

The first element joining portion 61 is formed in a substantially rectangular parallelepiped shape having surfaces facing in the circuit board perpendicular direction A, the first circuit board surface direction B, and the second circuit board surface direction C. The first element joining portion 61 is disposed so as to overlap the first semiconductor element 4 in the circuit board perpendicular direction A, but not to overlap the second semiconductor element 5.

An end surface, on the first semiconductor element 4 side, of the first element joining portion 61 is joined to a main surface of the first semiconductor device 4, using a conductive adhesive (not shown), such as solder. Additionally, an end surface, on the second circuit board 3 side, of the first element joining portion 61 is joined to the first conductive layer 32A of the second circuit board 3, suing a conductive adhesive (not shown), such as solder. In other words, the first element joining portion 61 is sandwiched between the first semiconductor element 4 and the second circuit board 3, without through the second semiconductor element 5.

The first element joining portion 61 of the connector 6 and the second semiconductor element 5 are both joined to the first conductive layer 32A of the second circuit board 3. In the first conductive layer 32A of the second circuit board 3, however, a region joined with the first element joining portion 61 of the connector 6 is electrically independent from a region joined with the second semiconductor element 5.

The second element joining portion 62 includes a first rectangular parallelepiped portion 62a and a second rectangular parallelepiped portion 62b which are formed in a substantially rectangular parallelepiped shape having surfaces facing in the circuit board perpendicular direction A, the first circuit board surface direction B, and the second circuit board surface direction C, and a connecting portion 62c connecting the first rectangular parallelepiped portion 62a and the second rectangular parallelepiped portion 62b. These are formed integrally and arranged in order of the first rectangular parallelepiped portion 62a, the connecting portion 62c, and the second rectangular parallelepiped portion 62b, from one side to the other side of the first circuit board surface direction B. Additionally, the first rectangular parallelepiped portion 62a, the second rectangular parallelepiped portion 62b, and the connecting portion 62c are formed in substantially the same dimension in the second circuit board surface direction C. This dimension is set to be smaller than the dimension of the first element joining portion 61 in the second circuit board surface direction C.

Further, an end surface, on the connecting portion 62c side, of the first rectangular parallelepiped portion 62a is coupled to an end face, on the first rectangular parallelepiped portion 62a side, of the connecting portion 62c. Additionally, an end surface, on the first circuit board 2 side, of the connecting portion 62c is coupled to a part of an end surface, on the second circuit board 3 side, of the second rectangular parallelepiped portion 62b. When viewed from the circuit board perpendicular direction A, the connecting portion 62c is formed smaller in dimension in the first circuit board surface direction B than the second rectangular parallelepiped portion 62b.

The second element joining portion 62 is disposed so as to overlap the second semiconductor element 5 in the circuit board perpendicular direction A, but not to overlap the first semiconductor element 4.

An end surface, on the second semiconductor element 5 side, of the first rectangular parallelepiped portion 62a is joined to a main surface of the second semiconductor element 5, using a conductive adhesive (not shown), such as solder. Additionally, an end surface, on the first circuit board 2 side, of the first rectangular parallelepiped portion 62a is separated from the first circuit board 2.

An end surface, on the first semiconductor element 2 side, of the second rectangular parallelepiped portion 62b is joined to the first conductive layer 22A of the first circuit board 2, using a conductive adhesive (not shown), such as solder. Additionally, an end surface, on the second circuit board 3 side, of the second rectangular parallelepiped portion 62b is separated from the second circuit board 3.

The connecting portion 62c is not joined to the first circuit board 2, the second circuit board 3, the first semiconductor element 4, and the second semiconductor element 5.

Such the second element joining portion 62 including the first rectangular parallelepiped portion 62a, the second rectangular parallelepiped portion 62b, and the connecting portion 62c is sandwiched between the second semiconductor element 5 and the first circuit board 2, without through the first semiconductor element 4.

The second element joining portion 62 of the connector 6 and the first semiconductor element 4 are both joined to the first conductive layer 22A of the first circuit board 2. In the conductive layer 22A of the first circuit board 2, however, a region joined with the second element joining portion 62 of the connector 6 is electrically independent from a region joined with the semiconductor element 4.

The connecting portion 63 is formed in a substantially rectangular parallelepiped shape having surfaces facing in the circuit board perpendicular direction A, the first circuit board surface direction B, and the second circuit board surface direction C. Additionally, the connecting portion 63 is disposed between the first element joining portion 61 and the first rectangular parallelepiped portion 62a of the second element joining portion 62. Further, the connecting portion 63 connects the first element joining portion 61 and the second element joining portion 62. Here, the connecting portion 63 is not joined to the first circuit board 2, the second circuit board 3, the first semiconductor element 4, and the second semiconductor element 5.

Here, the connector 6 may be joined to an external connecting lead (not shown). For example, as shown in FIG. 2, the connector 6 may be provided with an external connecting portion 64 to be joined to an external connecting lead. The external connecting portion 64 shown in FIG. 2 is formed in a shape extending from the first element joining portion 61 in a direction away from the connecting portion 63 in the first circuit board surface direction B.

The semiconductor module 1A of the present embodiment may include, for example, a connecting terminal (not shown) for connecting the circuitry of the semiconductor module 1A to an external portion. In this case, it is sufficient for the connecting terminal to be joined to, for example, the first semiconductor element 4, the second semiconductor element 5, and the first conductive layer 22A and 32A.

In the semiconductor module 1A of the present embodiment configured as described above, heat generated in the first semiconductor element 4 by energization is transferred to the first circuit board 2, and also to the second circuit board 3 through the first element joining portion 61 of the connector 6. Additionally, heat generated in the second semiconductor element 5 is transferred to the second circuit board 3, and also to the first circuit board 2 through the second element joining portion 62 of the connector 6.

Then, the heat of the semiconductor element 4 and the second semiconductor element 5 transferred to the first circuit board 2 and the second circuit board 3 can be released outside the semiconductor module 1A. For example, in the first circuit board 2 and the second circuit board 3, heat sinks are made in contact with the other conductive layers 22 and 32 positioned on the opposite sides of the first conductive layers 22A and 32A, thereby making it possible to efficiently release the above-described heat outside the semiconductor module 1A.

Next, operation and effect of the above-described semiconductor module 1A according to the first embodiment will be described with reference to the drawings.

In the semiconductor module 1A according to the first embodiment, the first semiconductor device 4 and the second semiconductor element 5 are arranged at the positions so as not to overlap with each other in the circuit board perpendicular direction A. Additionally, the connector 6 includes the first element joining portion 61 sandwiched between the first semiconductor element 4 and the second circuit board 3 without through the second semiconductor element 5. Thereby, it is possible to transfer the heat of the first semiconductor device 4 directly to the second circuit board 3 without through the second semiconductor element 5.

Further, the connector 6 includes the second element joining portion 62 sandwiched between the second semiconductor element 5 and the first circuit board 2 without through the first semiconductor element 4. Thereby, the heat of the second semiconductor element 5 can be transferred directly to the first circuit board 2 without through the first semiconductor element 4.

For this reason, the heat of the first semiconductor element 4 and the second semiconductor element 5 can be efficiently released from both the first circuit board 2 and the second circuit board 3.

Moreover, the heat released from the first semiconductor element 4 hardly flows into the second semiconductor element 5. For this reason, it is possible to suppress the second semiconductor element 5 from being heated by the heat released from the first semiconductor element 4. Additionally, similarly, the heat released from the second semiconductor element 5 hardly flows into the first semiconductor element 4. For this reason, it is possible to suppress the first semiconductor element 4 from being heated by the heat released from the second semiconductor element 5.

From the above, it is possible to provide the semiconductor module 1A with high radiation.

Second Embodiment

Next, a second embodiment will be described with reference to the accompanying drawings. Here, the same or similar members and portions as those of the above-described first embodiment will be appended with the same reference symbols, and description thereof is omitted. Hereinafter, a configuration different from that of the first embodiment will be described.

Figure 3A:
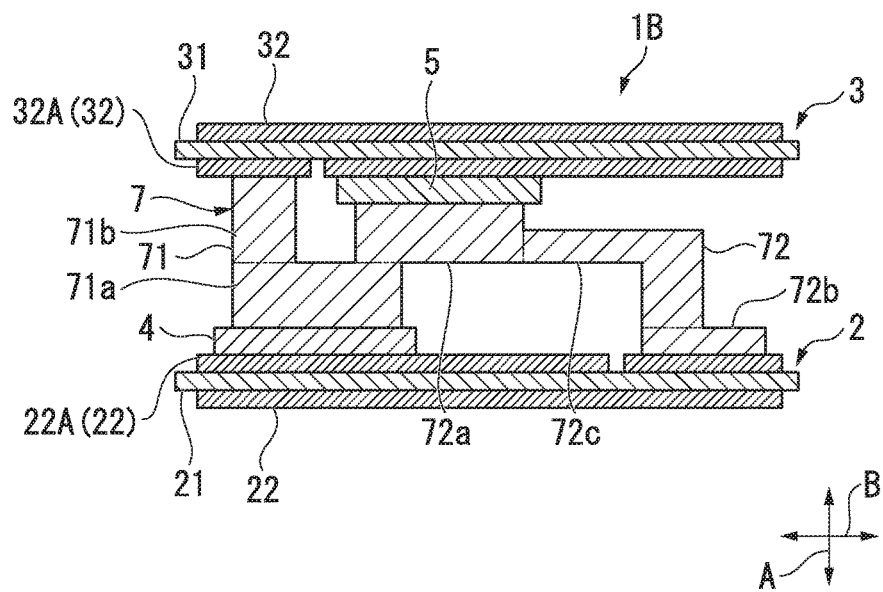
FIG. 3A is a diagram showing an example of a semiconductor module according to a second embodiment of invention.
Figure 3B:
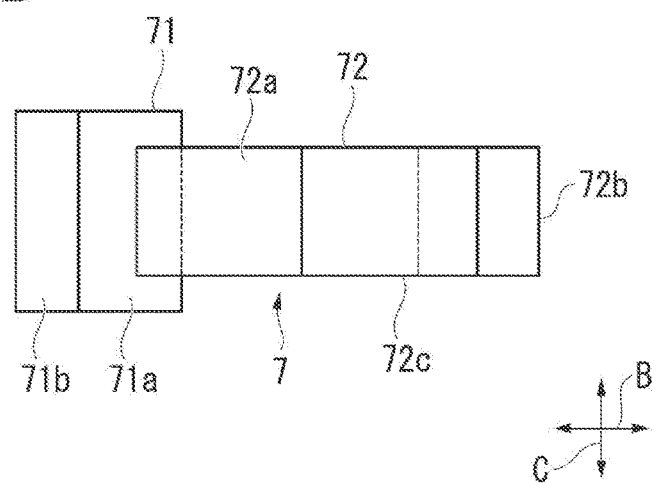
FIG. 3B is a diagram showing a connector shown in FIG. 3A viewed from the first circuit board side in the circuit board perpendicular direction.

As shown in FIGS. 3A and 3B, a semiconductor module 1B according to the second embodiment is disposed so that a part of the first semiconductor element 4 overlaps a part of the second semiconductor element 5 in the circuit board perpendicular direction A. Preferably, the area of the overlapping portion of the first semiconductor element 4 and the second semiconductor element 5, which is viewed in the circuit board perpendicular direction A, is, for example, ⅓ to ½ the area of the first semiconductor element 4.

In the present embodiment, a connector 7 includes a first element joining portion 71 joined to the first semiconductor element 4 and a second element joining portion 72 joined to the second semiconductor element 5. The first element joining portion 71 and the second element joining portion 72 are formed integrally.

The first element joining portion 71 includes a first rectangular parallelepiped portion 71a and a second rectangular parallelepiped portion 71b which are formed in a substantially rectangular shape having surfaces facing in the circuit board perpendicular direction A, the first circuit board surface direction B, and the second circuit board surface direction C. These are formed integrally and arranged in order of the first rectangular parallelepiped portion 71a and the second rectangular parallelepiped portion 71b, from the first circuit board 2 side to the second circuit board 3 side of the circuit board perpendicular direction A. Additionally, the first rectangular parallelepiped portion 71a and the second rectangular parallelepiped portion 71b are formed in substantially the same dimension in the second circuit board surface direction C.

Further, a part of an end surface, on the second circuit board 3 side, of the first rectangular parallelepiped portion 71a is coupled to an end surface, on the first circuit board 2 side, of the second rectangular parallelepiped portion 71b. When viewed from the circuit board perpendicular direction A, the first rectangular parallelepiped portion 71a is formed larger in dimension in the first circuit board surface direction B than the second rectangular parallelepiped portion 71b.

An end surface, on the first semiconductor element 4 side, of the first rectangular parallelepiped portion 71a is joined to the main surface of the first semiconductor device 4, using an conductive adhesive (not shown), such as solder. Additionally, one part and another part of the end surface, on the second circuit board 3 side, of the first rectangular parallelepiped portion 71a are respectively joined to the second rectangular parallelepiped portion 71b and the second element joining portion 72. Further, the remaining other part of the end surface, on the second circuit board 3 side, of the first rectangular parallelepiped portion 71a is separated from the second circuit board 3 and the second semiconductor element 5.

An end surface, on the second circuit board 3 side, of the second rectangular parallelepiped portion 71b is joined to the first conductive layer 32A of the second circuit board 3, using a conductive adhesive (not shown), such as solder.

Additionally, an end surface, on the first circuit board 2 side, of the second rectangular parallelepiped portion 71b is joined to the first rectangular parallelepiped portion 71a.

Such the first element joining portion 71 including the first rectangular parallelepiped portion 71a and the second rectangular parallelepiped portion 71b is sandwiched between the first semiconductor element 4 and the second circuit board 3, without through the second semiconductor element 5.

The first element joining portion 71 of the connector 7 and the second semiconductor element 5 are both joined to the first conductive layer 32A of the second circuit board 3. In the first conductive layer 32A of the second circuit board 3, however, a region joined with the first element joining portion 71 of the connector 7 is electrically independent from a region joined with the second semiconductor element 5.

The second element joining portion 72 includes a first rectangular parallelepiped portion 72a and a second rectangular parallelepiped portion 72b which are formed in a substantially rectangular parallelepiped shape having surfaces facing in the the circuit board perpendicular direction A, the first circuit board surface direction B, and the second circuit board surface direction C, and a connecting portion 72c connecting the first rectangular parallelepiped portion 72a and the second rectangular parallelepiped portion 72b. These are integrally formed and arranged in order of the first rectangular parallelepiped portion 72a, the connecting portion 72c, and the second rectangular parallelepiped portion 72b, from one side to the other side of the first circuit board surface direction B. Additionally, the first rectangular parallelepiped portion 72a, the second rectangular parallelepiped portion 72b, and the connecting portion 72c are formed in substantially the same dimension in the second circuit board surface direction C. This dimension is set to be smaller than the dimension of the first element joining portion 61 in the second circuit board surface direction C.

Further, an end surface, on the connecting portion 72c side, of the first rectangular parallelepiped portion 72a is coupled to an end face, on the first rectangular parallelepiped portion 72a side, of the connecting portion 72c. Additionally, an end surface, on the first circuit board 2 side, of the connecting portion 72c is coupled to a part of an end surface, on the second circuit board 3 side, of the second rectangular parallelepiped portion 72b. When viewed from the circuit board perpendicular direction A, the connecting portion 72c is formed smaller in dimension in the first circuit board surface direction B than the second rectangular parallelepiped portion 72b.

An end surface, on the second semiconductor element 5 side, of the first rectangular parallelepiped portion 72a is joined to the main surface of the second semiconductor element 5, using a conductive adhesive (not shown), such as solder. Additionally, an end surface, on the first circuit board 2 side, of the first rectangular parallelepiped portion 72a is separated from the first circuit board 2.

An end surface, on the first circuit board 2 side, of the second rectangular parallelepiped portion 72b is joined to the first conductive layer 22A of the first circuit board 2, using a conductive adhesive (not shown), such as solder. Additionally, an end surface, on the second circuit board 3 side, of the second rectangular parallelepiped portion 72b is separated from the second circuit board 3.

The connecting portion 72c is not joined to the first circuit board 2, the second circuit board 3, the first semiconductor element 4, and the second semiconductor element 5.

Such the second element joining portion 72 including the first rectangular parallelepiped portion 72a, the second rectangular parallelepiped portion 72b, and the connecting portion 72c is sandwiched between the second semiconductor element 5 and the first circuit board 2, without through the first semiconductor element 4.

The second element joining portion 72 of the connector 7 and the first semiconductor element 4 are both joined to the first conductive layer 22A of the first circuit board 2. In the conductive layer 22A on the first circuit board 2, however, a region bonded with the second element joining portion 72 of the connector 7 is electrically independent from a region bonded with the first semiconductor element 4.

In such the connector 7, at the overlapping portion of the first semiconductor element 4 and the second semiconductor element 5 in the circuit board perpendicular direction A, the first rectangular parallelepiped portion 71a of the first element joining portion 71 is connected to the first rectangular parallelepiped portion 72a of the second element joining portion 72.

In the semiconductor module 1B of the present embodiment configured as described above, similarly to the first embodiment, heat generated in the first semiconductor element 4 is transferred to the first circuit board 2, and also to the second circuit board 3 through the first element joining portion 71 of the connector 7. Additionally, heat generated in the second semiconductor element 5 is transferred to the second circuit board 3, and also to the first circuit board 2 through the second element joining portion 72 of the connector 7.

Then, the heat of the semiconductor element 4 and the second semiconductor element 5 transferred to the first circuit board 2 and the second circuit board 3 can be released outside the semiconductor module 1B.

According to the semiconductor module 1B of the second embodiment, similar effects to those of the first embodiment are achieved.

Additionally, according to the semiconductor module 1B of the present embodiment, the first semiconductor element 4 and the second semiconductor element 5 are arranged so that the part of the first semiconductor element 4 overlaps the part of the second semiconductor element 5 in the circuit board perpendicular direction A. Accordingly, it is possible to reduce the size viewed from the circuit board perpendicular direction A, as compared to the semiconductor module 1A of the first embodiment. In other words, it is possible to reduce the size of the semiconductor module 1B.

Although the embodiments of the semiconductor module according to the present invention have been described, the present invention is not limited to the above embodiments, and can be appropriately modified without departing from the scope thereof.

For example, in the above embodiments, the conductive layers of the first circuit board 2 and the second circuit board 3 are provided on both main surfaces of the ceramic plates 21 and 31, but may be provided only on ones of the main surfaces of the ceramic plates 21 and 31.

Additionally, for example, a sealing resin sealing the first semiconductor element 4, the second semiconductor element 5, and the connectors 6 and 7 may be provided between the first circuit board 2 and the second circuit board 3.

Furthermore, it is sufficient for the first circuit board 2 and the second circuit board 3 to have at least thermal conductivity and electrical conductivity so as to be electrically connected to the first semiconductor element 4 and the second semiconductor element 5. Accordingly, the first circuit board 2 and the second circuit board 3 are not limited to ceramic boards, and may be aluminum boards.

Figure 4A:
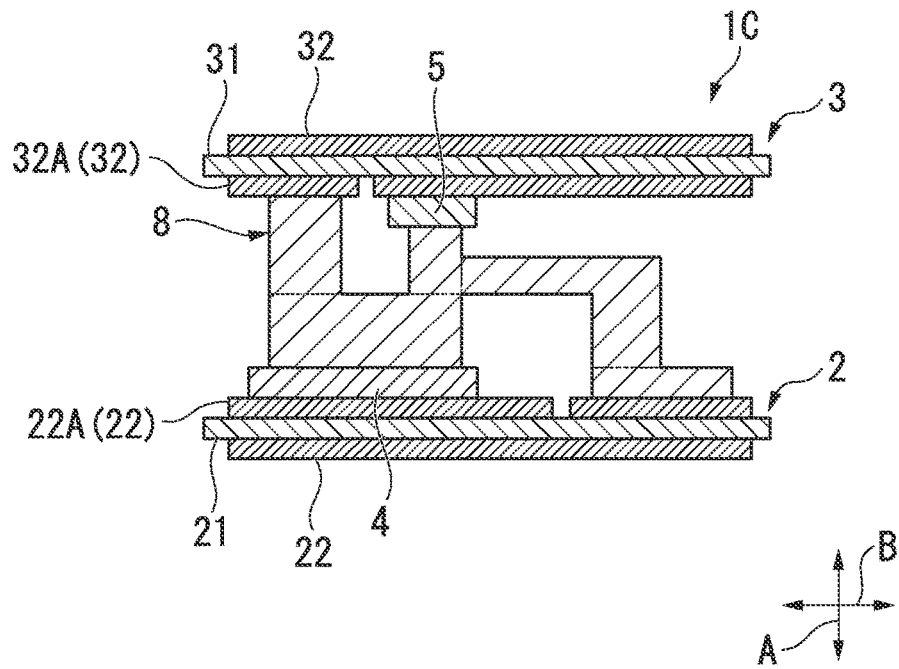
FIG. 4A is a diagram showing a modified example of the semiconductor modules according to the embodiments of the present invention.
Figure 4B:
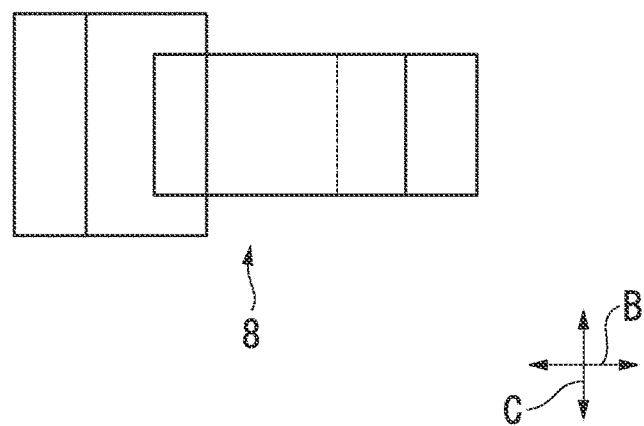
FIG. 4B is a diagram showing a connector shown in FIG. 4A viewed from the first circuit board side in the circuit board perpendicular direction.
Figure 5:
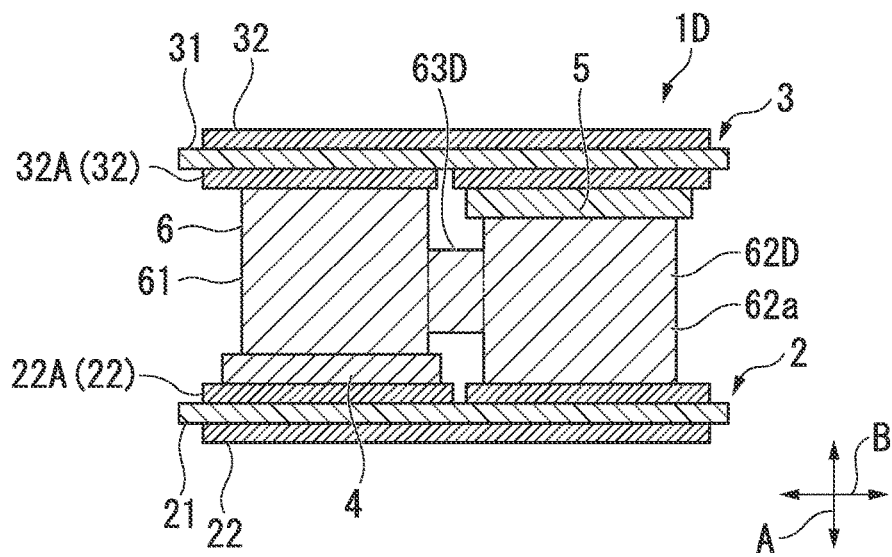
FIG. 5 is a diagram showing a modified example of the semiconductor module according to the first embodiment of the present invention.

Moreover, in the second embodiment described above, the first semiconductor element 4 and the second semiconductor element 5 are arranged so as to partially overlap each other in the circuit board perpendicular direction A. However, for example, like a semiconductor module 1C shown in FIGS. 4A and 5B, when viewed from the circuit board perpendicular direction A, the first semiconductor element 4 may be formed larger than the second semiconductor element 5, and the first semiconductor element 4 and the second semiconductor element 5 may be arranged so that a part of the first semiconductor element 4 overlaps the entire or substantially entire second semiconductor element 5 in the circuit board perpendicular direction A. Even in this configuration, it is sufficient for a connector 8 connecting the first semiconductor element 4 and the second semiconductor element 5 to have at least a portion which is sandwiched between the first semiconductor element 4 and the second circuit board 3 without through the second semiconductor element 5, and which is in contact with the first semiconductor element 4 and the second circuit board 3.

Additionally, in the first embodiment described above, the second element joining portion 62 includes the first rectangular parallelepiped portion 62a, the second rectangular parallelepiped portion 62b, and the connecting portion 62c. In contrast, like a semiconductor module 1D shown in FIG. 5, a configuration may be such that: a second element joining portion 62D includes the first rectangular parallelepiped portion 62a without including the second rectangular parallelepiped portion 62b and the connecting portion 62c; an end surface, on the second semiconductor element 5 side, of the first rectangular parallelepiped portion 62a is joined to the main surface of the second semiconductor element 5, using a conductive adhesive (not shown), such as solder; and an end surface, on the first circuit board 2 side, of the first rectangular parallelepiped portion 62a is joined to the first conductive layer 22A of the first circuit board 2, using a conductive adhesive (not shown), such as solder.

In such a case, heat generated in the second semiconductor element 5 can be transferred not only to the second circuit board 3, but also to the first circuit board 2 through the second element joining portion 62D of the connector 6.

Figure 6:
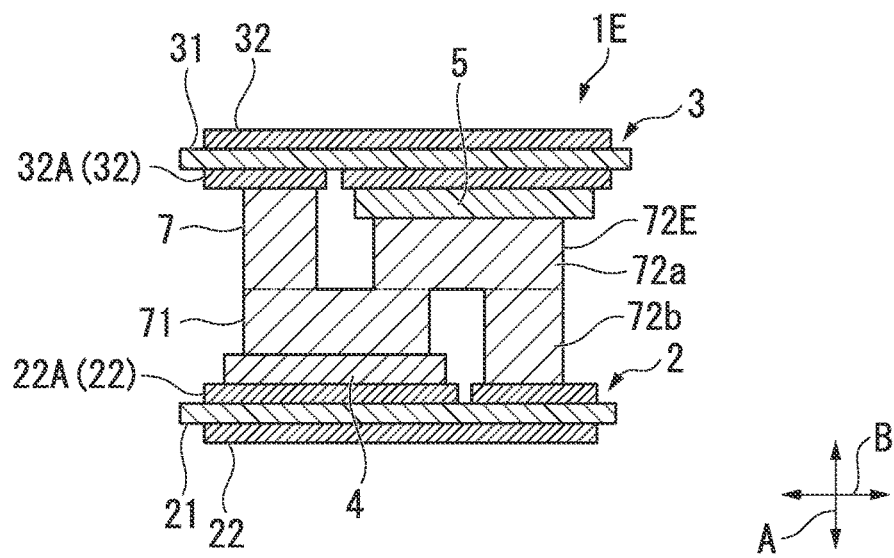
FIG. 6 is a diagram showing a modified example of the semiconductor module according to the second embodiment of the present invention.

Furthermore, in the second embodiment described above, the second element joining portion 72 includes the first rectangular parallelepiped portion 72a, the second rectangular parallelepiped portion 72b, and the connecting portion 72c. In contrast, like a semiconductor module 1E shown in FIG. 6, a configuration may be such that: a second element joining portion 72E includes the first rectangular parallelepiped portion 72a and the second rectangular parallelepiped portion 72b without including the connecting portion 72c; an end surface, on the second semiconductor element 5 side, of the first rectangular parallelepiped portion 72a is joined to the main surface of the second semiconductor element 5, using a conductive adhesive (not shown), such as solder; a part of an end surface, on the first circuit board 2 side, of the first rectangular parallelepiped portion 72a is joined to a part of an end surface, on the second circuit board 3 side, of the second rectangular parallelepiped portion 72b; and an end surface, on the first circuit board 2 side, of the second rectangular parallelepiped portion 72b is joined to the first conductive layer 22A of the first circuit board 2, using a conductive adhesive (not shown), such as solder.

Also in such a case, heat generated in the second semiconductor element 5 can be transferred not only to the second circuit board 3, but also to the first circuit board 2 through the second element joining portion 72E of the connector 7.

Moreover, in the above-described embodiments, the connectors 6, 7 and 8 are formed in a shape combining substantially rectangular parallelepiped members. However, the connectors 6, 7 and 8 may be formed in an appropriate preferred shape, such as a substantially cylindrical shape, a substantially Z-shaped cross-sectional shape, or a shape combining rod-shaped or plate-like members.

DESCRIPTION OF REFERENCE NUMERALS 1A to 1E: semiconductor module
2: first circuit board
3: second circuit board
4: first semiconductor element
5: second semiconductor element
6, 7, 8: connector
A: circuit board perpendicular direction

The invention claimed is:
1. A semiconductor module comprising:
a first circuit board having thermal conductivity and having a first surface;
a second circuit board having thermal conductivity and having a second surface opposing the first surface of the first circuit board;
a first semiconductor element mounted on the first surface of the first circuit board;
a second semiconductor element mounted on the second surface of the second circuit board; and
a connector having thermal conductivity and electrically connecting the first semiconductor element and the second semiconductor element,
wherein the connector includes
a first element joining portion connecting the first semiconductor element and the second surface of the second circuit board while not being in contact with the first surface of the first circuit board and the second semiconductor element, and
a second element joining portion connecting the second semiconductor element and the first surface of the first circuit board while not being in contact with the second surface of the second circuit board and the first semiconductor element, the second element joining portion being connected to the first element joining portion.
2. The semiconductor module according to claim 1, wherein the first semiconductor element and the second semiconductor element are arranged so as not to overlap each other when viewed in a direction perpendicular to the first surface of the first circuit board and the second surface of the second circuit board, the second circuit board being substantially parallel to the first circuit board.

* * * * *